(12) United States Patent
Kizilyalli et al.

(10) Patent No.: US 10,347,736 B2
(45) Date of Patent: Jul. 9, 2019

(54) HIGH POWER GALLIUM NITRIDE ELECTRONICS USING MISCUT SUBSTRATES

(71) Applicant: Nexgen Power Systems, Inc., Santa Clara, CA (US)

(72) Inventors: Isik C. Kizilyalli, San Francisco, CA (US); Dave P. Bour, Cupertino, CA (US); Thomas R. Prunty, Santa Clara, CA (US); Gangfeng Ye, Fremont, CA (US)

(73) Assignee: Nexgen Power Systems, Inc., Santa Clara, CA (US)

( * ) Notice: Subject to any disclaimer, the term of this patent is extended or adjusted under 35 U.S.C. 154(b) by 0 days.

(21) Appl. No.: 15/697,161

(22) Filed: Sep. 6, 2017

(65) Prior Publication Data

US 2018/0166556 A1    Jun. 14, 2018

Related U.S. Application Data

(60) Continuation of application No. 15/156,979, filed on May 17, 2016, now abandoned, which is a division of
(Continued)

(51) Int. Cl.
*H01L 29/20* (2006.01)
*H01L 29/66* (2006.01)
(Continued)

(52) U.S. Cl.
CPC .... *H01L 29/66204* (2013.01); *H01L 21/0243* (2013.01); *H01L 21/0254* (2013.01);
(Continued)

(58) Field of Classification Search
CPC .......... H01L 21/02433; H01L 21/0254; H01L 21/02458; H01L 21/0262; H01L 33/16;
(Continued)

(56) References Cited

U.S. PATENT DOCUMENTS

2007/0200177 A1\* 8/2007 Hata ............... B82Y 20/00
257/347
2008/0113496 A1\* 5/2008 Keller ............... C30B 25/02
438/481

(Continued)

FOREIGN PATENT DOCUMENTS

CN    101009350 A    8/2007
CN    101090062 A    12/2007
(Continued)

OTHER PUBLICATIONS

U.S. Appl. No. 14/071,032, "Non Final Office Action", dated Aug. 24, 2015, 9 pages.
(Continued)

*Primary Examiner* — Jonathan Han
(74) *Attorney, Agent, or Firm* — Kilpatrick Townsend & Stockton LLP

(57) ABSTRACT

A method of fabricating an electronic device includes providing a III-V substrate having a hexagonal crystal structure and a normal to a growth surface characterized by a misorientation from the <0001> direction of between 0.15° and 0.65°. The method also includes growing a first III-V epitaxial layer coupled to the III-V substrate and growing a second III-V epitaxial layer coupled to the first III-V epitaxial layer. The method further includes forming a first contact in electrical contact with the III-V substrate and forming a second contact in electrical contact with the second III-V epitaxial layer.

19 Claims, 13 Drawing Sheets

Related U.S. Application Data application No. 14/071,032, filed on Nov. 4, 2013, now Pat. No. 9,368,582.

(51) Int. Cl.

| | |
|---|---|
| *H01L 29/861* | (2006.01) |
| *H01L 21/02* | (2006.01) |
| *H01L 21/76* | (2006.01) |
| *H01L 29/04* | (2006.01) |
| *H01L 29/06* | (2006.01) |

(52) U.S. Cl.
CPC .. *H01L 21/02389* (2013.01); *H01L 21/02433* (2013.01); *H01L 21/02458* (2013.01); *H01L 21/02634* (2013.01); *H01L 21/7605* (2013.01); *H01L 29/045* (2013.01); *H01L 29/0657* (2013.01); *H01L 29/2003* (2013.01); *H01L 29/6609* (2013.01); *H01L 29/861* (2013.01); *H01L 29/8613* (2013.01); *H01L 29/0649* (2013.01)

(58) Field of Classification Search
CPC .......... H01L 21/0237; H01L 21/02579; H01L 29/045; H01L 21/02008; H01L 21/02027; H01L 29/8611; C30B 25/02; C30B 25/18
USPC ...... 257/E21.09, E33.003, E33.005, E21.056
See application file for complete search history.

(56) References Cited

U.S. PATENT DOCUMENTS

| | | | | |
|---|---|---|---|---|
| 2008/0219910 | A1* | 9/2008 | Kasai | C30B 25/02 423/409 |
| 2011/0018106 | A1 | 1/2011 | Scholz et al. | |
| 2011/0089520 | A1 | 4/2011 | Lieten et al. | |
| 2011/0216795 | A1* | 9/2011 | Hsu | B82Y 20/00 372/44.011 |
| 2011/0243172 | A1* | 10/2011 | Lin | B82Y 20/00 372/45.012 |
| 2011/0286484 | A1* | 11/2011 | Raring | B82Y 20/00 372/44.011 |
| 2012/0217617 | A1 | 8/2012 | Dadgar et al. | |
| 2013/0032814 | A1 | 2/2013 | Bour et al. | |
| 2015/0123138 | A1 | 5/2015 | Kizilyalli et al. | |
| 2017/0133481 | A1 | 5/2017 | Kizilyalli et al. | |

FOREIGN PATENT DOCUMENTS

| | | |
|---|---|---|
| CN | 105765725 | 7/2016 |
| JP | 2006093683 A | 4/2006 |
| JP | 2007299861 A | 11/2007 |
| JP | 2010205918 A | 9/2010 |
| JP | 2010245234 A | 10/2010 |
| JP | 2013033983 A | 2/2013 |
| JP | 2013211552 A | 10/2013 |
| WO | 2009088081 A1 | 7/2009 |
| WO | 2015066596 A1 | 5/2015 |

OTHER PUBLICATIONS

U.S. Appl. No. 14/071,032, "Notice of Allowance", dated Feb. 18, 2016, 8 pages.
U.S. Appl. No. 15/156,979, "Non-Final Office Action", dated Mar. 7, 2017, 10 pages.
PCT/US2014/063656, "International Preliminary Report on Patentability", dated May 19, 2016, 8 pages.
PCT/US2014/063656, "International Search Report and Written Opinion", dated Feb. 13, 2015, 12 pages.
CN201480060457.X, "Office Action", dated Aug. 2, 2018, 7 pages.
JP2016-552433, "Office Action", dated Jul. 27, 2018, 17 pages.
JP2016-552433, "Notice of Allowance", dated Feb. 4, 2019, 3 pages.
CN201480060457.X, "Office Action", dated Apr. 11, 2019, 8 pages.

\* cited by examiner

HIGH POWER GALLIUM NITRIDE ELECTRONICS USING MISCUT SUBSTRATES

CROSS-REFERENCES TO RELATED APPLICATIONS

This application is a continuation of Ser. No. 15/156,979, filed May 17, 2016; which is a division of U.S. patent application Ser. No. 14/071,032, filed on Nov. 4, 2013, now U.S. Pat. No. 9,368,582, issued on Jun. 14, 2016. The disclosures of which are hereby incorporated by reference in their entirety for all purposes.

BACKGROUND OF THE INVENTION

Power electronics are widely used in a variety of applications. Power electronic devices are commonly used in circuits to modify the form of electrical energy, for example, from ac to dc, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to the fabrication of gallium nitride (GaN) based epitaxial layers useful for high power electronics. In a particular embodiment, a GaN substrate with the growth plane misoriented from the (0001) plane by less than one degree in relation to the <1$\bar{1}$00> direction is utilized in an epitaxial growth process. The surface morphology and electrical properties of epitaxial layers grown on the misoriented substrate are suitable for use in high power electronic devices. The methods and techniques can be applied to a variety of compound semiconductor systems including diodes, FETs, and the like.

According to an embodiment of the present invention, an electronic device is provided. The electronic device includes a substrate having a hexagonal crystal structure and a normal to a growth surface characterized by a misorientation from the <0001> direction of between 0.15° and 0.65°. The electronic device also includes a first epitaxial layer coupled to the III-V substrate and a second epitaxial layer coupled to the first epitaxial layer. The electronic device further includes a first contact in electrical contact with the substrate and a second contact in electrical contact with the second epitaxial layer.

According to another embodiment of the present invention, a method of fabricating an electronic device is provided. The method includes providing a III-V substrate having a hexagonal crystal structure and a normal to a growth surface characterized by a misorientation from the <0001> direction of between 0.15° and 0.65°. The method also includes growing a first epitaxial layer coupled to the III-V substrate and growing a second epitaxial layer coupled to the first epitaxial layer. The method further includes forming a first contact in electrical contact with the substrate and forming a second contact in electrical contact with the second epitaxial layer.

Numerous benefits are achieved by way of the present invention over conventional techniques. For example, embodiments of the present invention provide methods and systems for fabricating epitaxial layers suitable for use in high power electronics devices. In an embodiment, device performance during high voltage operation (e.g., voltages greater than 200 V) is improved in comparison with conventional designs. These and other embodiments of the invention, along with many of its advantages and features, are described in more detail in conjunction with the text below and attached figures.

DETAILED DESCRIPTION OF SPECIFIC EMBODIMENTS

Figure 1:
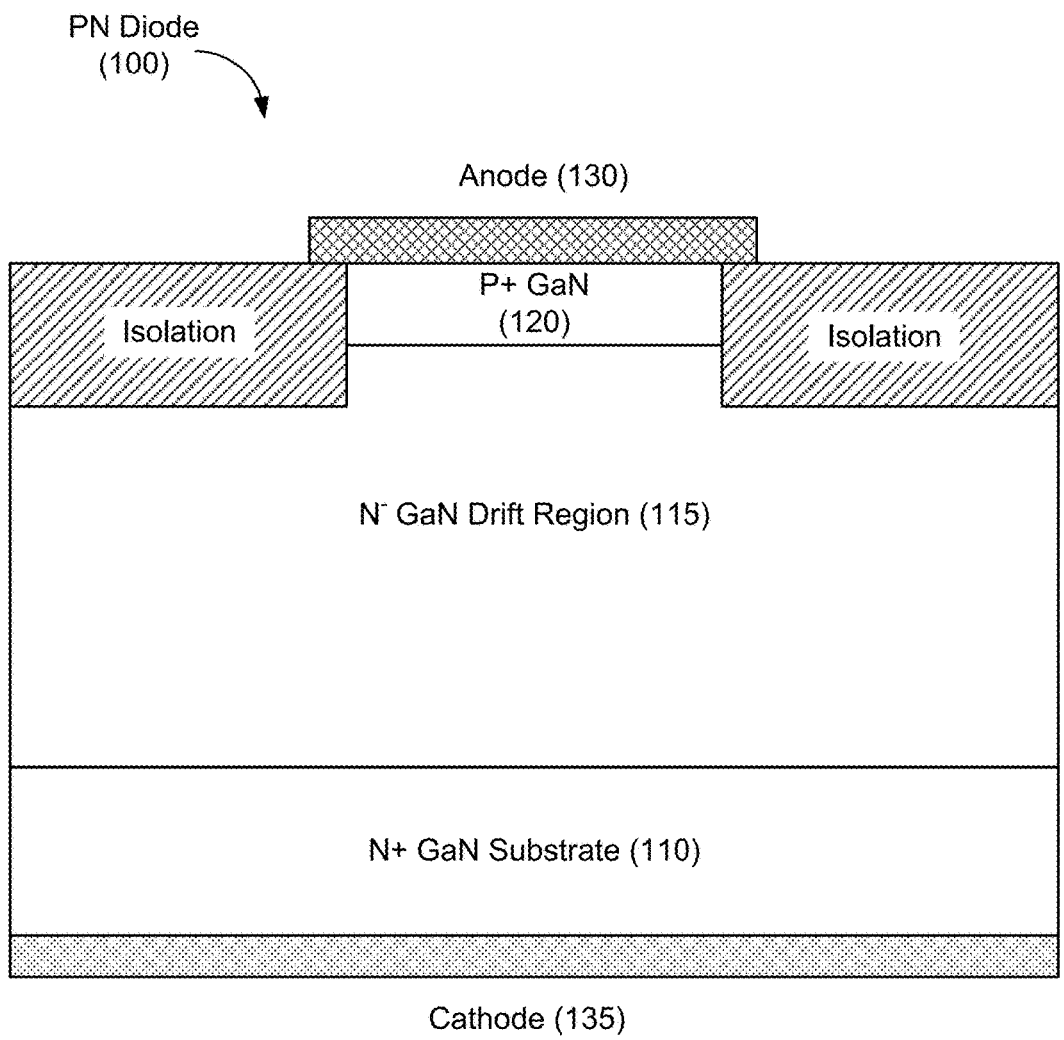
FIG. 1 is a simplified cross-sectional diagram of a high voltage PN diode structure according to an embodiment of the present invention.

Embodiments of the present invention relate to electronic devices. More specifically, the present invention relates to the fabrication of gallium nitride (GaN) based epitaxial layers useful for high power electronics. In a particular embodiment, a GaN substrate with the growth plane misoriented from the (0001) plane by less than one degree in relation to the <1$\bar{1}$00> direction is utilized in an epitaxial growth process. The surface morphology and electrical properties of epitaxial layers grown on the misoriented substrate are suitable for use in high power electronic devices. The methods and techniques can be applied to a variety of compound semiconductor systems including diodes, FETs, and the like.

GaN-based electronic and optoelectronic devices are undergoing rapid development. Desirable properties associated with GaN and related alloys and heterostructures include high bandgap energy for visible and ultraviolet light emission, favorable transport properties (e.g., high electron mobility and saturation velocity), a high breakdown field, and high thermal conductivity. According to embodiments of the present invention, gallium nitride (GaN) epitaxy on pseudo-bulk GaN substrates is utilized to fabricate vertical GaN-based semiconductor devices not possible using conventional techniques. For example, conventional methods of growing GaN include using a foreign substrate such as silicon carbide (SiC). This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create vertical devices, including power electronic devices such as JFETs and other field-effect transistors.

Homoepitaxial GaN layers on bulk GaN substrates, on the other hand, are utilized in the embodiments described herein to provide superior properties to conventional techniques and devices. For instance, electron mobility, μ, is higher for a given background doping level, N. This provides low resistivity, ρ, because resistivity is inversely proportional to electron mobility, as provided by equation (1):

$$\rho = \frac{1}{q\mu N}, \quad (1)$$

where q is the elementary charge.

Another superior property provided by homoepitaxial GaN layers on bulk GaN substrates is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by the equation:

$$R = \frac{\rho L}{A}, \quad (2)$$

where A is the cross-sectional area of the channel or current path.

In general, a tradeoff exists between the physical dimension of a device needed to support high voltage in a device's off-state and the ability to pass current through the same device with low resistance in the on-state. In many cases GaN is preferable over other materials in minimizing this tradeoff and maximizing performance. In addition, GaN layers grown on bulk GaN substrates have low defect density compared to layers grown on mismatched substrates. The low defect density will give rise to superior thermal conductivity, less trap-related effects such as dynamic on-resistance, and better reliability.

FIG. 1 is a simplified cross-sectional diagram of a high voltage PN diode structure according to an embodiment of the present invention. Referring to FIG. 1, a first gallium-nitride (GaN) epitaxial layer 115 (e.g., a N⁻ GaN drift region) is formed on a GaN substrate 110 having the same conductivity type. The GaN substrate 110 can be a pseudo-bulk or bulk GaN material on which the first GaN epitaxial layer 115 is grown. A buffer layer (not shown) can be utilized as will be evident to one of skill in the art. Dopant concentrations (e.g., doping density) of the GaN substrate 110 can vary, depending on desired functionality. For example, a GaN substrate 110 can have an n+ conductivity type, with dopant concentrations ranging from $1\times10^{17}$ cm$^{-3}$ to $1\times10^{19}$ cm$^{-3}$. Although the GaN substrate 110 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

The properties of the first GaN epitaxial layer 115 can also vary, depending on desired functionality. The first GaN epitaxial layer 115 can serve as a drift region for the PN diode, and therefore can be a relatively low-doped material. For example, the first GaN epitaxial layer 115 can have an n− conductivity type, with dopant concentrations ranging from $1\times10^{14}$ cm$^{-3}$ to $1\times10^{18}$ cm$^{-3}$. Furthermore, the dopant concentration can be uniform, or can vary, for example, as a function of the thickness of the drift region.

The thickness of the first GaN epitaxial layer 115 can also vary substantially, depending on the desired functionality. As discussed above, homoepitaxial growth can enable the first GaN epitaxial layer 115 to be grown far thicker than layers formed using conventional methods. In general, in some embodiments, thicknesses can vary between 0.5 μm and 100 μm, for example. In other embodiments thicknesses are greater than 5 μm. Resulting parallel plane breakdown voltages for the PN diode 100 can vary depending on the embodiment. Some embodiments provide for breakdown voltages of at least 100V, 300V, 600V, 1.2 kV, 1.7 kV, 3.3 kV, 5.5 kV, 13 kV, or 20 kV.

Referring once again to FIG. 1, a second GaN epitaxial layer 120 is formed above the first GaN epitaxial layer 115. The second GaN epitaxial layer 120 is used in forming the p-type region of the PN diode and has a conductivity type different than the first GaN epitaxial layer 115. For instance, if the first GaN epitaxial layer 115 is formed from an n-type GaN material, the second GaN epitaxial layer 120 will be formed from a p-type GaN material, and vice versa. As illustrated in FIG. 1, isolation regions are formed to define the lateral extent of the PN diode. Suitable techniques for forming the isolation regions characterized by high resistivity can include ion implantation, etching and epitaxial regrowth of low conductivity material, etching and deposition of insulating materials such as oxides and/or nitrides, combinations thereof, or the like. One of ordinary skill in the art would recognize many variations, modifications, and alternatives.

The thickness of the second GaN epitaxial layer 120 can vary, depending on the process used to form the layer and the device design. In some embodiments, the thickness of the second GaN epitaxial layer 120 is between 0.1 μm and 5 μm. In other embodiments, the thickness of the second GaN epitaxial layer 120 is between 0.3 μm and 1 μm.

The second GaN epitaxial layer 120 can be highly doped, for example in a range from about $5\times10^{17}$ cm$^{-3}$ to about $1\times10^{19}$ cm$^{-3}$. Additionally, as with other epitaxial layers, the dopant concentration of the second GaN epitaxial layer 120 can be uniform or non-uniform as a function of thickness. In some embodiments, the dopant concentration increases with thickness, such that the dopant concentration is relatively low near the first GaN epitaxial layer 115 and increases as the distance from the first GaN epitaxial layer 115 increases. Such embodiments provide higher dopant concentrations at the top of the second GaN epitaxial layer 120 where metal contacts can be subsequently formed. Other embodiments utilize heavily doped contact layers (not shown) to form ohmic contacts.

One method of forming the second GaN epitaxial layer 120, and other layers described herein, can be through a regrowth process that uses an in-situ etch and diffusion preparation processes. These preparation processes are described more fully in U.S. patent application Ser. No. 13/198,666, filed on Aug. 4, 2011, the disclosure of which is hereby incorporated by reference in its entirety.

FIG. 1 also illustrates electrical contacts formed for the electronic device according to an embodiment of the present invention. As illustrated in FIG. 1, a metallic structure 135 is formed in electrical contact with the GaN substrate 110. The metallic structure 135 can be one or more layers of ohmic metal that serve as a contact for the cathode of the PN diode 100. For example, the metallic structure 135 can comprise a titanium-aluminum (Ti/Al) ohmic metal. Other metals and/or alloys can be used including, but not limited to, aluminum, nickel, gold, combinations thereof, or the like. In some embodiments, an outermost metal of the metallic structure 135 can include gold, tantalum, tungsten, palladium, silver, or aluminum, combinations thereof, and the like. The metallic structure 135 can be formed using any of a variety of methods such as sputtering, evaporation, or the like.

FIG. 1 also illustrates an additional metallic structure 130 in electrical contact with the second epitaxial layer 120. The additional metallic structure 130 can be one or more layers of ohmic metal including metals and/or alloys similar to the metallic structure 135. The additional metallic structure 130 is formed on the second epitaxial layer 120 to serve as the anode contact of the PN diode 100. The additional metallic structure 130 can be formed using a variety of techniques, including lift-off and/or deposition with subsequent etching, which can vary depending on the metals used. Example metals include nickel-gold (Ni/Au), and the like. In some implementations, the additional metallic structure 130 is formed in contact with the first epitaxial layer and a Schottky metal is utilized as appropriate to the formation of a Schottky diode.

Different dopants can be used to create n- and p-type GaN epitaxial layers and structures disclosed herein. For example, n-type dopants can include silicon, oxygen, or the like. P-type dopants can include magnesium, beryllium, calcium zinc, or the like.

Although some embodiments are discussed in terms of GaN substrates and GaN epitaxial layers, the present invention is not limited to these particular binary III-V materials and is applicable to a broader class of III-V materials, in particular III-nitride materials. Additionally, although a GaN substrate is illustrated in FIG. 1, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention.

The fabrication process discussed in relation to FIG. 1 utilize a process flow in which an n-type drift layer is grown using an n-type substrate. However, the present invention is not limited to this particular configuration. In other embodiments, substrates with p-type doping are utilized. Additionally, embodiments can use materials having an opposite conductivity type to provide devices with different functionality. Thus, although some examples relate to the growth of n-type GaN epitaxial layer(s) doped with silicon, in other embodiments the techniques described herein are applicable to the growth of highly or lightly doped material, p-type material, material doped with dopants in addition to or other than silicon such as Mg, Ca, Be, Ge, Se, S, O, Te, and the like. The substrates discussed herein can include a single material system or multiple material systems including composite structures of multiple layers. One of ordinary skill in the art would recognize many variations, modifications, and alternatives.

During the growth of the epitaxial layers illustrated in FIG. 1, the inventors have determined that epitaxial layers grown on substrates characterized by predetermined miscut angles provide improved performance in the context of high power electronic devices (e.g., operation at high voltages) in comparison with conventional structures. For epitaxial layers grown on the c-plane of a GaN substrate, the layer morphology, and importantly, the performance of devices formed using these epitaxial layers, degrades at higher voltages, reducing their applicability to high power applications. The inventors have determined that, without limiting embodiments of the present invention, misorientation of the substrate growth surface from the crystallographic planes (e.g., the c-plane) by a fraction of a degree in a predetermined direction, improves layer morphology and device performance for devices fabricated using such improved layers.

Figure 8A:
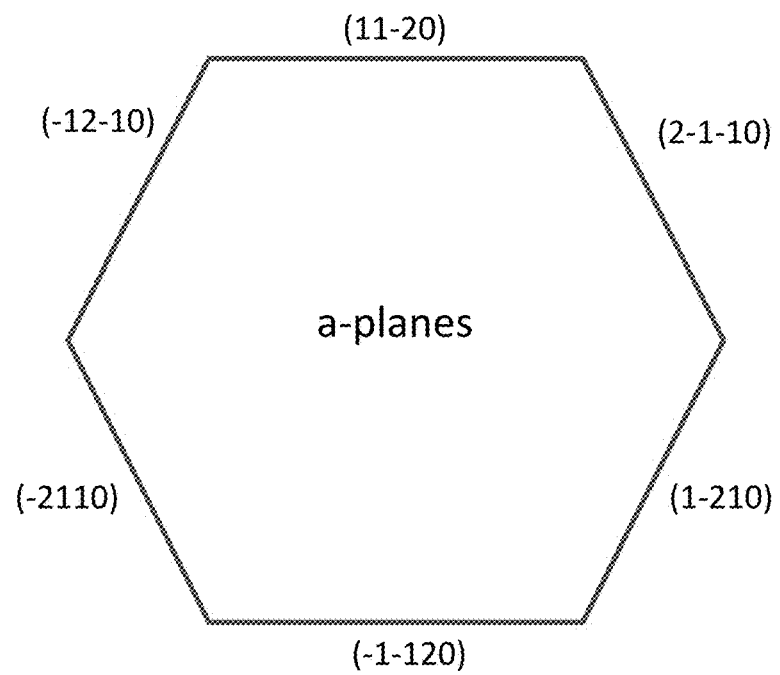
FIGS. 8A-8B are diagrams illustrating crystal planes of Wurtzite crystals.
Figure 8B:
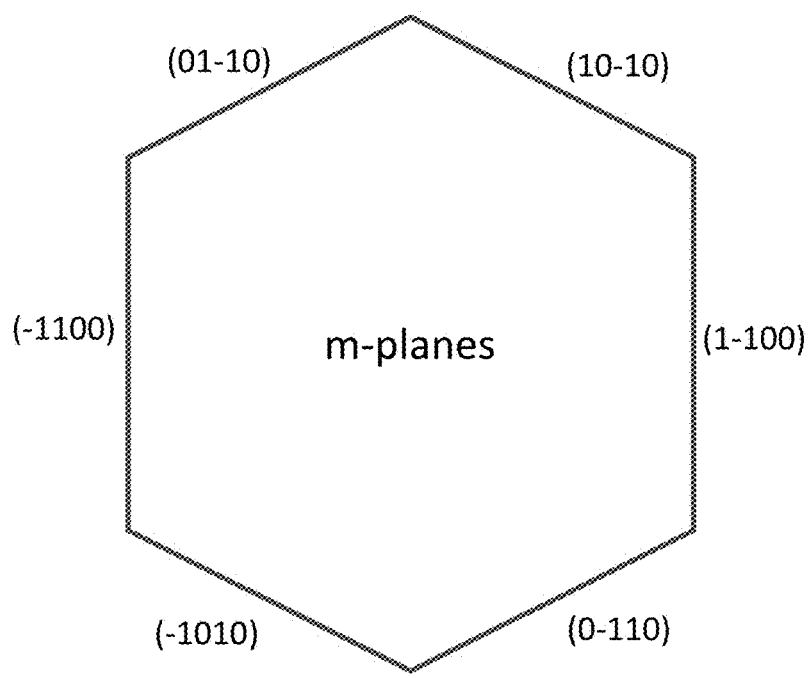

FIGS. 8A-8B are diagrams illustrating crystal planes of Wurtzite crystals. In FIG. 8A, the a-planes of a Wurtzite crystal are illustrated and in FIG. 8B, the m-planes of a Wurtzite crystal are illustrated. The c-axis (0001) is normal to the plane of the figures and the (000−1) axis points into the plane of the figures. As illustrated in FIG. 8A, there are six a-planes, all 60° apart. As illustrated in FIG. 8B, there are six m-planes, all 60° apart. When overlaid, the m- and a-planes interpenetrate, an angle of 30° between these planes. As will be evident to one of skill in the art, GaN has a Wurtzite crystalline structure.

Figure 2A:
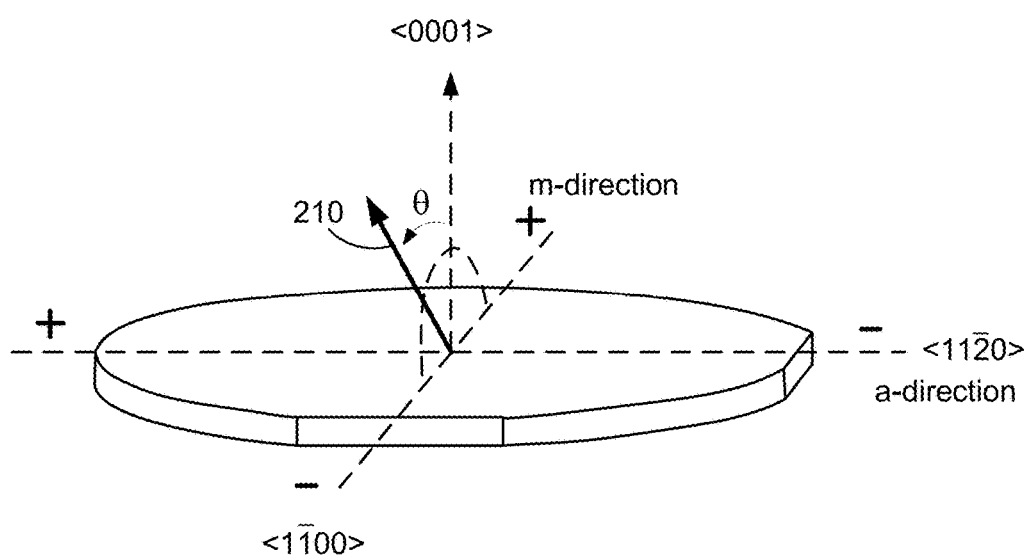
FIG. 2A is a schematic diagram illustrating Miller indices of a hexagonal-phase bulk GaN substrate wafer.

FIG. 2A is a schematic diagram illustrating Miller indices of a hexagonal-phase bulk GaN substrate wafer. The dashed arrows indicate the direction of the <0001>, <1$\bar{1}$00>, and <11$\bar{2}$0> directions. The solid arrow 210 indicates the direction of misorientation with respect to the <1$\bar{1}$00> direction utilized for the epitaxial growth of the high-voltage electronic device structures described according to some embodiments herein. As illustrated in FIG. 2A, embodiments of the present invention utilize substrates in which the growth plane is not aligned with the (0001) plane. As described herein, the normal to the growth plane is misoriented from the <0001> direction (i.e., a misorientation angle ($\theta$)) by 0<$\theta$<1.0° towards the −<1$\bar{1}$00> direction or the <1$\bar{1}$00> direction. According to some embodiments of the present invention, the magnitude of $\theta$ ranges from about 0.15°<$\theta$<0.65°. In a particular embodiment, the misorientation angle $\theta$ is about 0.4°<$\theta$<0.5°.

Thus, according to embodiments of the present invention, the growth plane of the III-V (e.g., GaN) substrate is misoriented from the c-plane towards the positive or negative m-direction at an angle having a value between zero and 1.0°. Additionally, the normal to the substrate growth surface can also be misoriented such that it also tilts towards or away from the a-direction. The misorientation away from the <0001> direction towards the a-direction is zero in some embodiments. In the embodiment illustrated in FIG. 2A, the normal to the growth surface is characterized by a misorientation from the <0001> direction toward the <1$\bar{1}$00> direction of between −0.15° and −0.65° and a misorientation from the <0001> direction toward the <11$\bar{2}$0> direction of zero.

In some embodiments, the orientation of the growth surface is such that the growth surface is tilted with respect to the (0001) plane, resulting in the normal to the growth surface being tilted by less than one degree toward the positive <1$\bar{1}$00> direction. The inventors have determined that tilting of the growth surface by misorientation away from the (0001) surface towards the negative m-direction by between 0.15° and 0.65° or towards the positive m-direction by between 0.15° and 0.65° results in improvements in the surface morphology for thick epitaxial layers and device performance accordingly. Thus, embodiments of the present invention provide growth surfaces tilted with respect to the (0001) surface by an angle greater than 0.15° and less than one degree. One of ordinary skill in the art would recognize many variations, modifications, and alternatives.

Figure 2B:
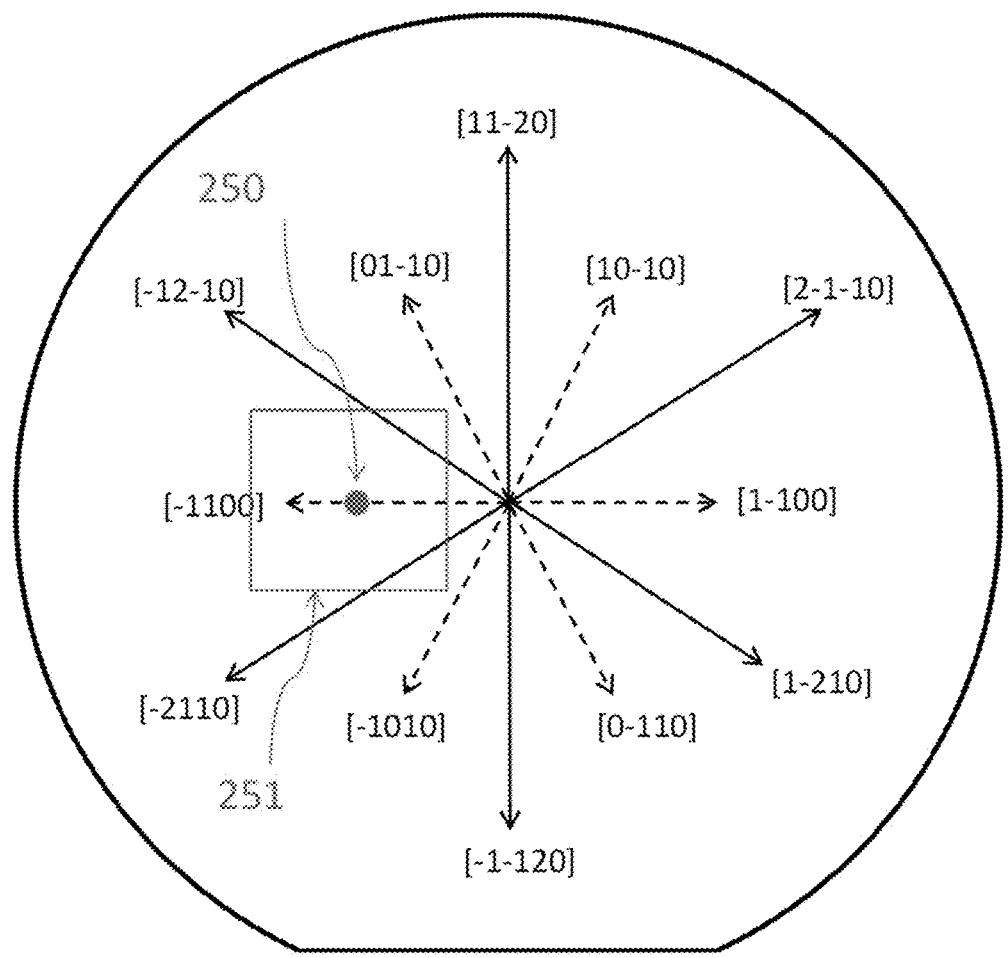
FIG. 2B is a schematic diagram showing the crystal axis directions for a c-face GaN crystal.

FIG. 2B is a schematic diagram illustrating miscut angles according to an embodiment of the present invention. The solid arrows are associated with a-planes and the dashed arrows are associated with m-planes. For this diagram, the c-axis is normal to the plane of the figure. According to embodiments of the present invention, for the GaN wafer, the c-plane is (nearly) normal to wafer surface, so that the m-directions and a-directions are oriented as illustrated in FIG. 2B. It should be noted that the example illustrated in FIG. 2B utilizes one axis convention, but other axis conventions can be utilized, including an axis convention that is rotated 180° relative to the wafer flat. Both conventions are symmetrically equivalent.

The miscut target direction 250 is pointed towards the left (parallel to flat) for each of the axis conventions. The predetermined specification window 251 can be represented as a box that is centered on an m-direction, but also includes a-directions. For the illustrated axis convention, the miscut target is along [−1100]. For the alternative axis convention that is rotated 180° relative to the wafer flat, the miscut target is along [1−100]. Therefore, for both conventions, if the flat is on the bottom side, both miscut targets point to the left.

Figure 2C:
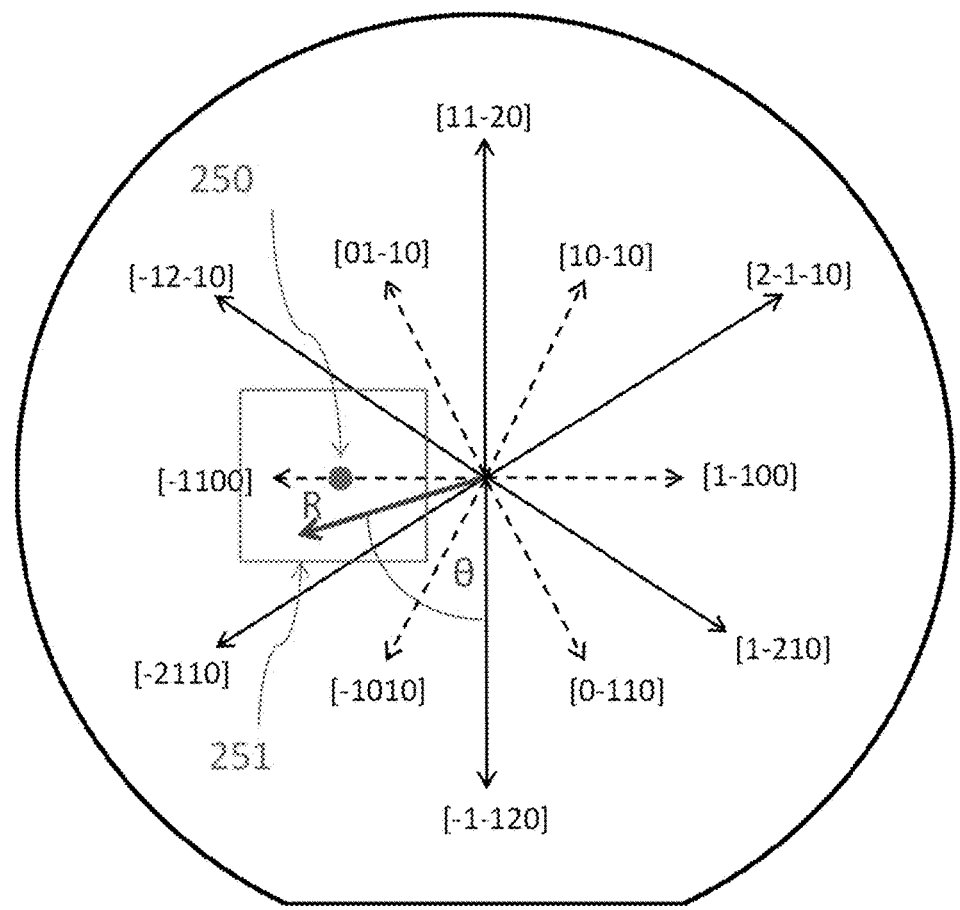
FIG. 2C is a schematic diagram illustrating the vector nature of the miscut angle according to an embodiment of the present invention.

FIG. 2C is a schematic diagram illustrating the vector nature of the miscut angle according to an embodiment of the present invention. As illustrated in FIG. 2C, the miscut angle R is a vector quantity, defined by components in the m- and a-directions. Both can vary independently across a wafer, and may have different effects. Physically, this vector can be considered as the crystallographic c-direction projected onto the plane defined by the surface of the wafer, as shown by the square region 250.

Figure 2D:
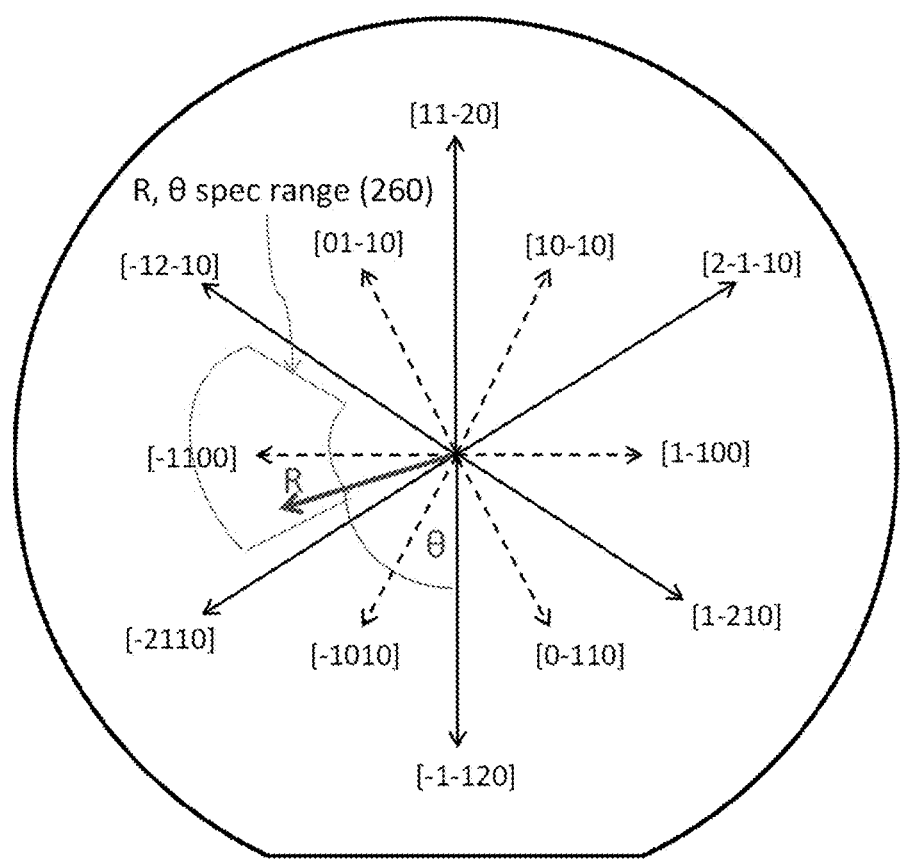
FIG. 2D is a schematic diagram illustrating the radial-vector nature of the miscut angle according to an embodiment of the present invention.

FIG. 2D is a schematic diagram illustrating an alternative specification for miscut angle according to an embodiment of the present invention. In FIG. 2D, the miscut specification 260, rather than being specified by the miscut angle with respect to the m-plane and a-plane components, could be specified by the magnitude |R| and the direction θ of the miscut angle, as shown by region 260.

Figure 3A:
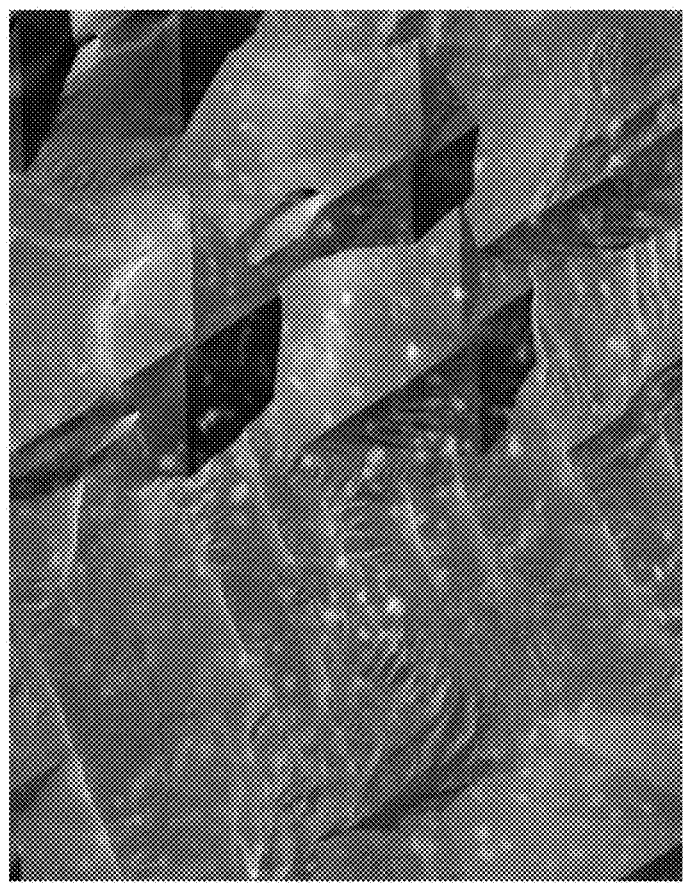
FIG. 3A is a Nomarski micrograph of epitaxial surface, for case when substrate misorientation is <0.15°.
Figure 3B:
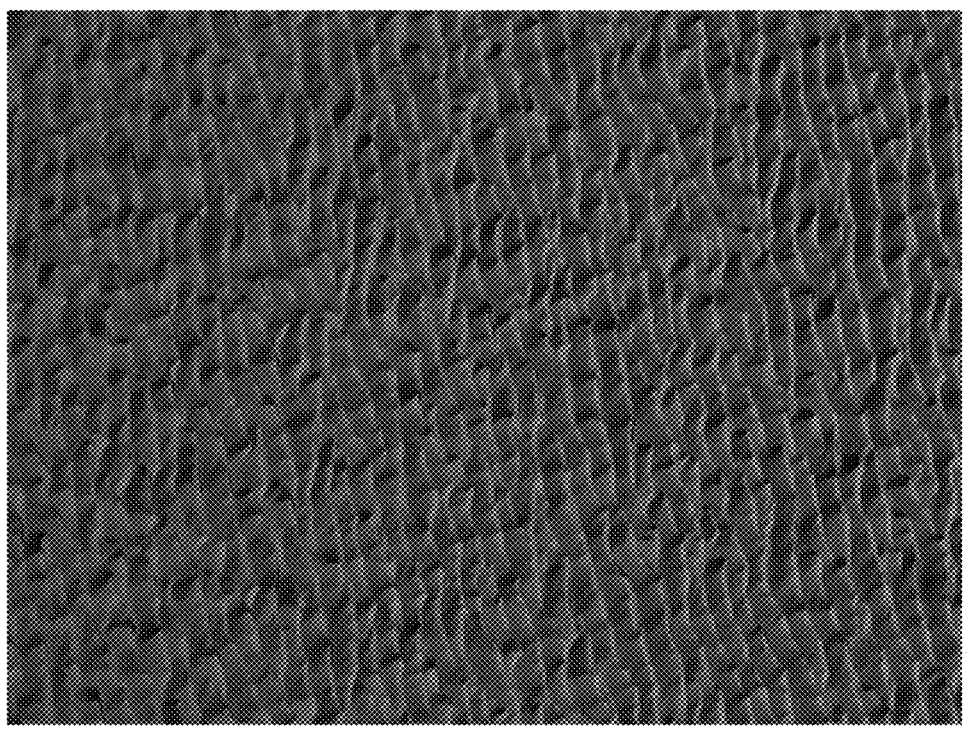
FIG. 3B is a Nomarski micrograph of epitaxial surface, for case when substrate misorientation is >0.65°.

FIG. 3A is a Nomarski micrograph of epitaxial surface, for case when substrate misorientation is <0.15°. FIG. 3B is a Nomarski micrograph of epitaxial surface, for case when substrate misorientation is >0.65°. As illustrated in FIG. 3A, the surface morphology of epitaxial layers grown on a substrate having a misorientation less than 0.15° is characterized by large hexagonal hillocks, with lateral dimensions on the order of tens to hundreds of microns and heights of up to several microns. The inventors believe that the lateral dimensions of the hillocks increases as the thickness of the epitaxial layers increases. Referring to FIG. 3B, the surface morphology of epitaxial layers grown on a substrate having a misorientation greater than 0.65° is characterized by a scalloped surface, which can also be referred to as a ridged or fish-scale surface, with lateral and vertical dimensions on the order of up to several microns. For both of these substrate misorientation values outside the range included within the scope of the present invention, devices fabricating using epitaxial layers grown on these substrates, are characterized by undesirable levels of device leakage during operation in high power regimes.

Figure 4A:
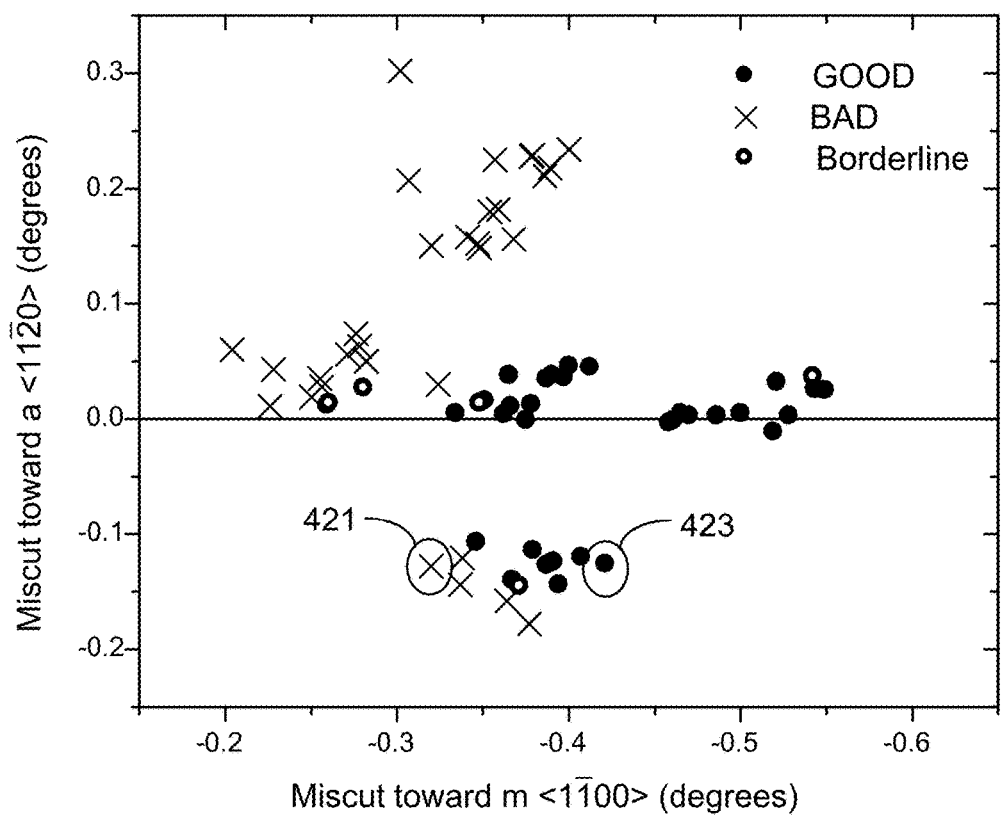
FIG. 4A is a plot showing the surface morphologies of various epitaxially grown layers mapped against substrate misorientation in orthogonal directions.

As described in additional detail in relation to FIG. 4A, the inventors have determined that a strong correlation exists between the substrate misorientation, the surface morphology, and the high power device performance. For substrate misorientations of ~0.4° to 0.5° from the in-direction, good surface morphology results, producing devices that have improved high power operating characteristics.

FIG. 4A is a plot showing the surface morphologies of various epitaxially grown layers mapped against substrate misorientation in orthogonal directions (i.e., the <1$\bar{1}$00> and <11$\bar{2}$0> directions). The vertical axis represents the miscut angle in degrees toward the a-direction (towards <11$\bar{2}$0>). The horizontal axis represents the miscut angle toward the m-direction (towards <1$\bar{1}$00>). As illustrated in FIG. 4A, good morphology for the epitaxial layers (solid black circles) results when the miscut angle (θ) is in vicinity of zero miscut toward the a-direction and ~0.35°-~0.55° degrees miscut toward the m-direction. In a particular embodiment, a miscut angle toward the m-direction of between −0.4°-0.5° is utilized.

It should be noted that holding the miscut angle of the substrate towards the a-direction at substantially zero degrees, good surface morphology can be obtained. Referring to FIG. 4A, it should also be noted that good surface morphology can also be obtained by adjusting both the misorientation with respect to the a-direction and the m-direction. As illustrated by the poor surface morphology for a-direction= −0.13° and m-direction= −0.33° (data point 421) and the good surface morphology obtained for miscut towards the a-direction by −0.13° and m-direction=−0.43° (data point 423), the increase in the absolute value of the miscut angle in the m-direction will also result in good surface morphology. Thus, variation in the miscut angle with respect to the a-direction can be compensated for by variation in the miscut angle with respect to the in-direction. One of ordinary skill in the art would recognize many variations, modifications, and alternatives.

Referring to FIG. 4A, 70 data points are illustrated, representing five points measured on 14 GaN substrates. Data provided in relation to the five points on each substrate included the miscut information. The miscut specification for these wafers was miscut toward the m-direction of −0.4° and miscut toward the a-direction of 0°, both with a tolerance±0.3°. The five points were imaged using Nomarski microscopy and judged to be Good (solid circles), Bad (x) or Borderline (open circles). The Good morphologies were obtained for miscut towards the a-direction close to 0° and miscut toward the m-direction of ~0.4°-~0.5°. Thus, as demonstrated by the data, a miscut with respect to the <0001> direction of less than −0.3° toward the m-direction results in poor morphology. Additionally, at high miscut angles (i.e., greater than ±0.6 with respect to the <0001> direction results in poor morphology.

Given the manufacturing tolerances and variation in crystal surface orientation across the wafer, embodiments of the present invention utilize a target miscut value that produces the largest possible area of material with good surface morphology (and consequent high device yield). As illustrated in FIG. 4A and discussed above, a larger miscut towards the m-direction can accommodate some variation in miscut towards the a-direction. Referring to FIG. 4A, an a-direction miscut of −0.13° is represented by the horizontal dashed line. For this value of a-direction miscut, an m-direction miscut of less than 0.35° produces poor morphology, while a greater m-direction miscut results in good morphologies. In this manner, the m-direction and a-direction miscuts interact to affect the morphology, and a larger m-direction miscut can be utilized to accommodate variation in a-direction miscut.

It should be noted that although the substrate specifications may specify a particular miscut orientation for the substrate, the variation in orientation across the substrate may result in some regions of the substrate being characterized by a misorientation within the ranges provided by embodiments of the present invention and other regions characterized by a misorientation outside the ranges provided by embodiments of the present invention. In other words, substrate manufacturers allow for some margin in miscut variation. The variation in miscut tends to be relatively large for pseudo-bulk GaN grown by HVPE on non-native substrates. Therefore the surface morphology will vary accordingly across the wafer, as indicated the data in FIG. 4A.

As an example, if the substrate specification is for a misorientation toward the m-direction of 0.3°±0.3°, then regions of the substrate can be characterized by zero misorientation while other regions are characterized by a misorientation of 0.6°. The inventors have determined that, for substrates with varying misorientation angles, the morphology is good in regions with a misorientation angle within the ranges of the embodiments described herein, which can be correlated to improved device performance.

Figure 4B:
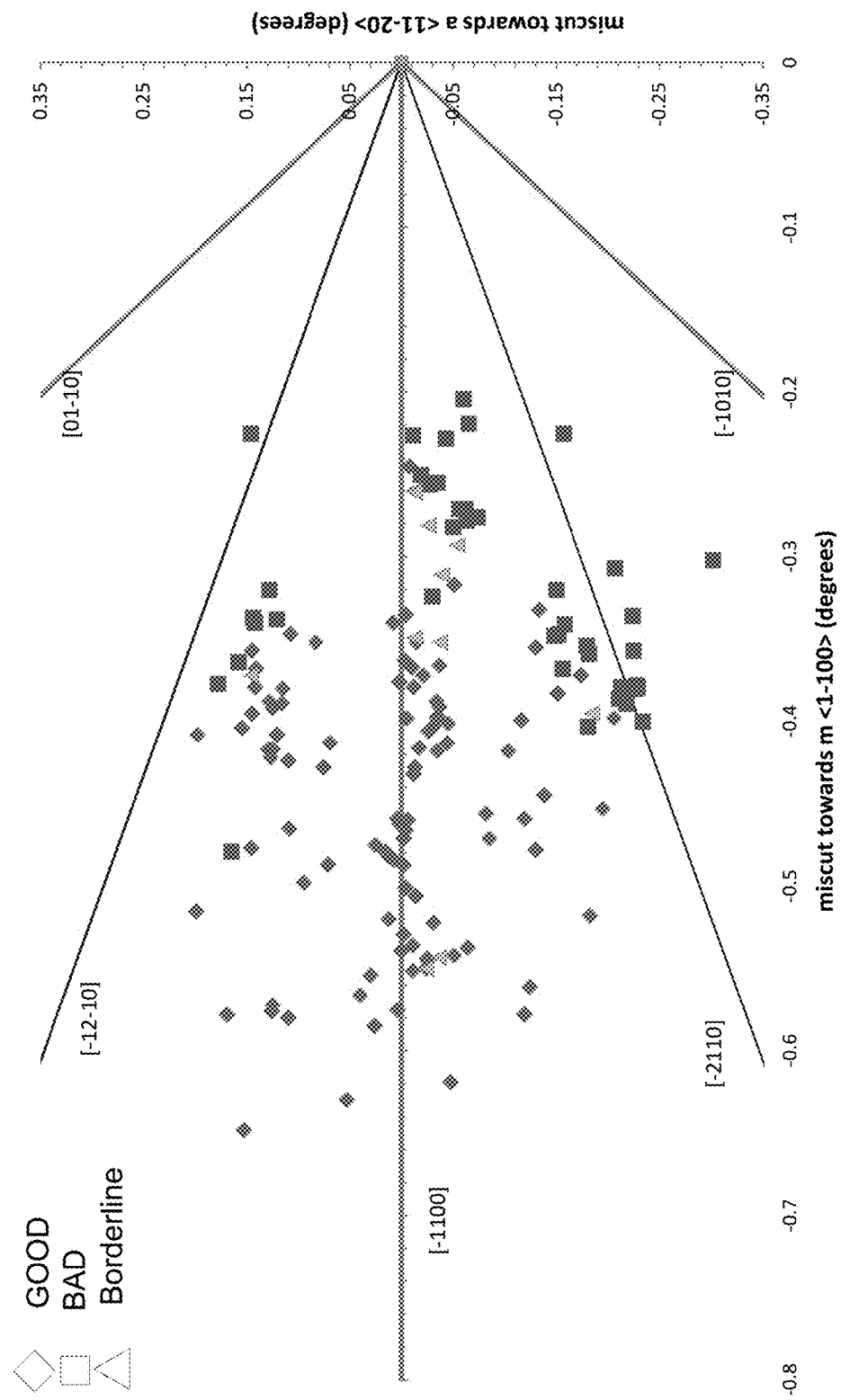
FIG. 4B is a plot showing wafer quality data as a function of miscut angle according to an embodiment of the present invention.

FIG. 4B is a plot showing wafer quality data as a function of miscut angle according to an embodiment of the present invention. The wafer quality data was measured based on Nomarski images taken from wafers grown with various miscut angles. Each point represents a vector, beginning at the origin and ending at the datapoint. Wafers with "Good" quality are indicated by diamond symbols, wafers with "Bad" quality are indicated by square symbols, and wafers with borderline quality are indicated by triangle symbols. By considering the miscut toward the a-direction, the inventors have determined that poor morphology may be related to miscut angle as well as to the magnitude.

Figure 5A:
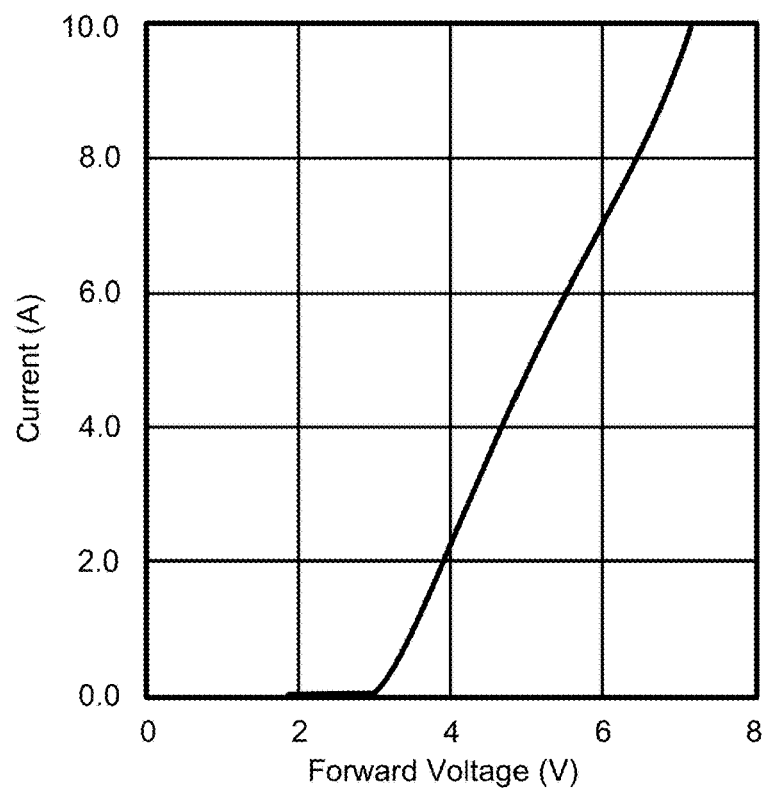
FIG. 5A is a plot showing the forward bias current-voltage characteristics of a high voltage PN diode according to an embodiment of the present invention.
Figure 5B:
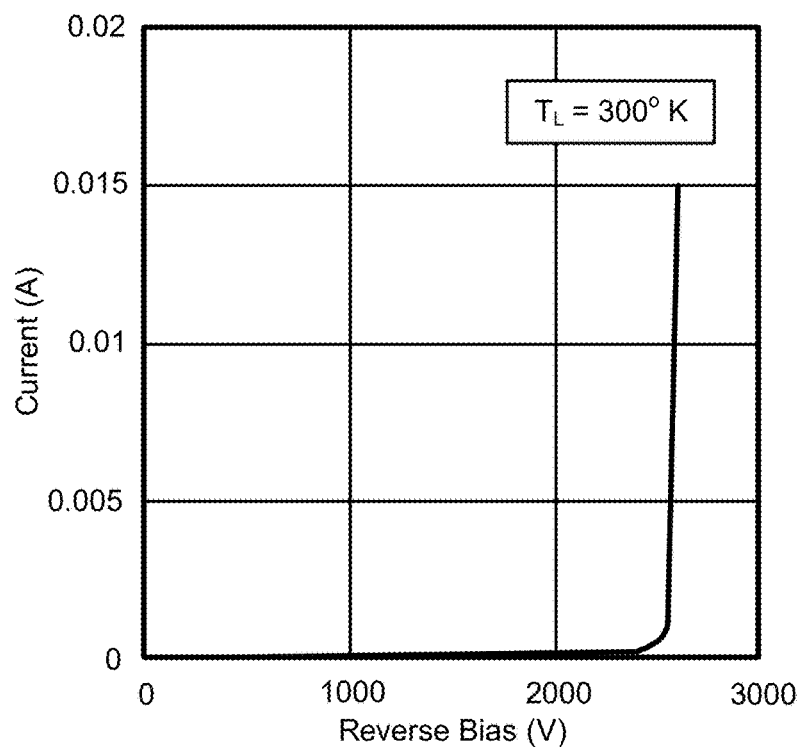
FIG. 5B is a plot showing the reverse bias current-voltage characteristics of a high voltage PN diode according to an embodiment of the present invention.

FIG. 5A is a plot showing the forward bias current-voltage characteristics of a high voltage PN diode according to an embodiment of the present invention. FIG. 5B is a plot showing the reverse bias current-voltage characteristics of a high voltage PN diode according to an embodiment of the present invention. As illustrated in FIG. 5A, the PN diode turns on at ∼3V with a substantially linear I-V characteristic. Referring to FIG. 5B, under reverse bias, the PN diode conducts substantially no current until the voltage reaches ∼2,500 V, at which breakdown occurs. Thus, embodiments of the present invention are suitable for high voltage (e.g., greater than 400 V) operation.

Figure 6:
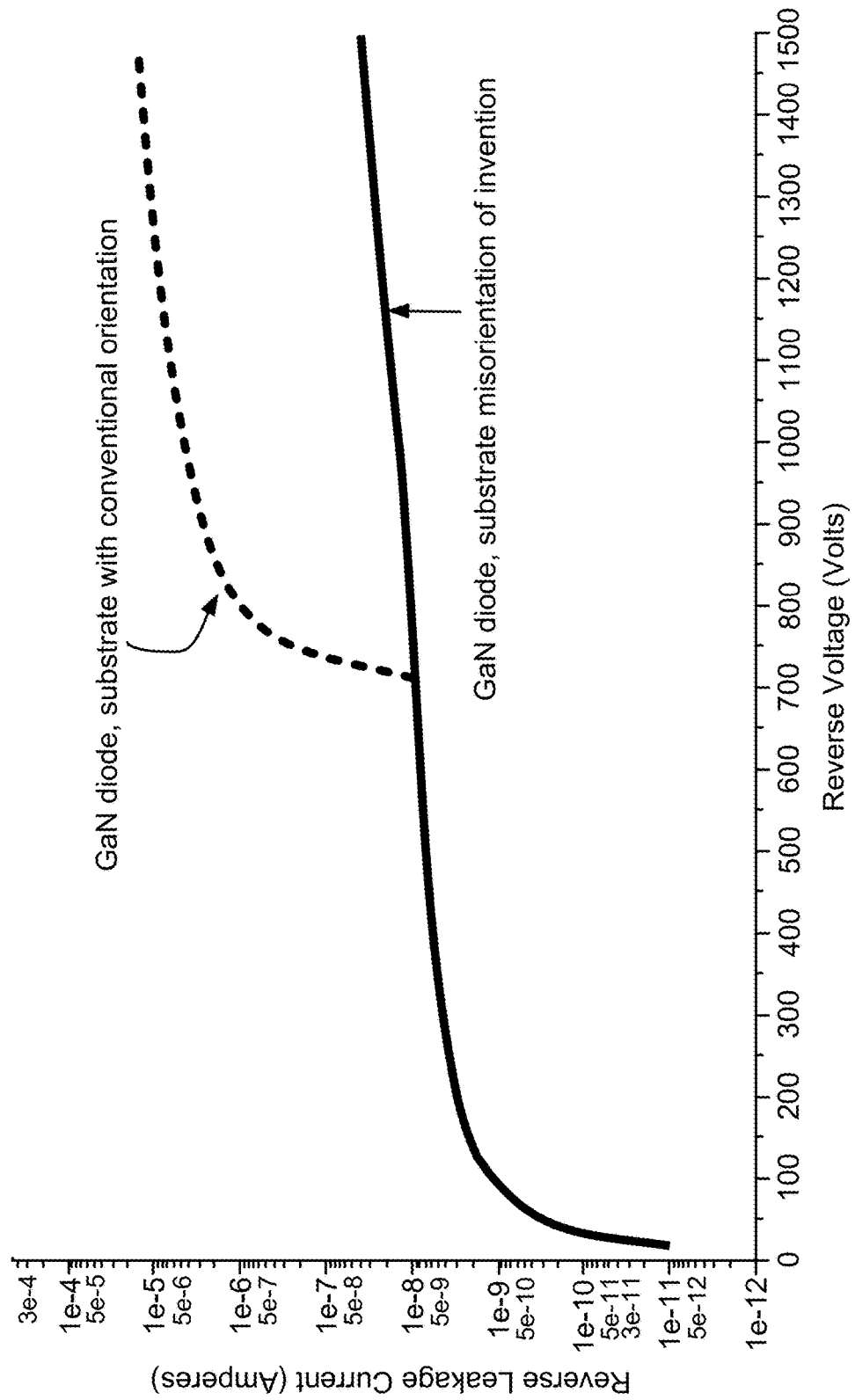
FIG. 6 is a plot showing the reverse bias current-voltage characteristics of a high-voltage GaN PN diode according to an embodiment of the present invention compared to a GaN PN diode fabricated using a conventional substrate.

FIG. 6 is a plot showing the reverse bias current-voltage characteristics of a high-voltage GaN PN diode according to an embodiment of the present invention (solid curve) compared to a GaN PN diode fabricated using a conventional substrate, which can include substrates that are cut at misorientation angles (θ) outside of the ranges suitable for use according to embodiments of the present invention.

As illustrated in FIG. 6, under reverse bias, the reverse leakage current is substantially the same up to voltages of ∼700 V. At reverse bias voltages over 700 V, although the high voltage PN diode fabricated according to embodiments of the present invention maintains a substantially linear increase in reverse leakage current with voltage (plotted on a logarithmic scale). Thus, in devices, for example, PN diodes, Schottky diodes, vertical JFETs, HEMTs, integrated FETs and diodes, merged PN/Schottky diodes, and the like, that operate at high voltages, e.g., >600 V, >1200 V, >1700 V, or the like, the use of substrates with a predetermined misorientation angle provide improved performance, particularly in high voltage regimes.

It should be noted that embodiments of the present invention are particularly suitable for applications in high power regimes. For low power regimes, associated with some LED and laser operation, and other forward bias operation, or the like, the impact of the substrate not being miscut within the predetermined range provided by embodiments of the present invention would not be detectable, since, as illustrated in FIG. 6, effects dependent on the proper miscut angle are not observable in some implementations until high power regimes are entered. Thus, embodiments of the present invention are suitable for device applications utilizing thick epitaxial layers (e.g., a drift layer>3 μm thick) that are operated in high power regimes (e.g., >200 V). Since conventional GaN devices operate in low power regimes (e.g., less than 200 V), the impact of the proper misorientation of the substrate would not have been observed during typical operation. The inventors, on the contrary, have appreciated the scope of the problem presented by substrates oriented at conventional orientations during operating in high power regimes. Thus, embodiments of the present invention are particularly applicable to devices in which one or more of the epitaxial layers are characterized by low doping and high thickness, for example, the drift layer of a vertical PN GaN diode. Thus, embodiments of the present invention are particularly suitable for devices that include epitaxial layers over 5 μm in thickness.

Figure 7:
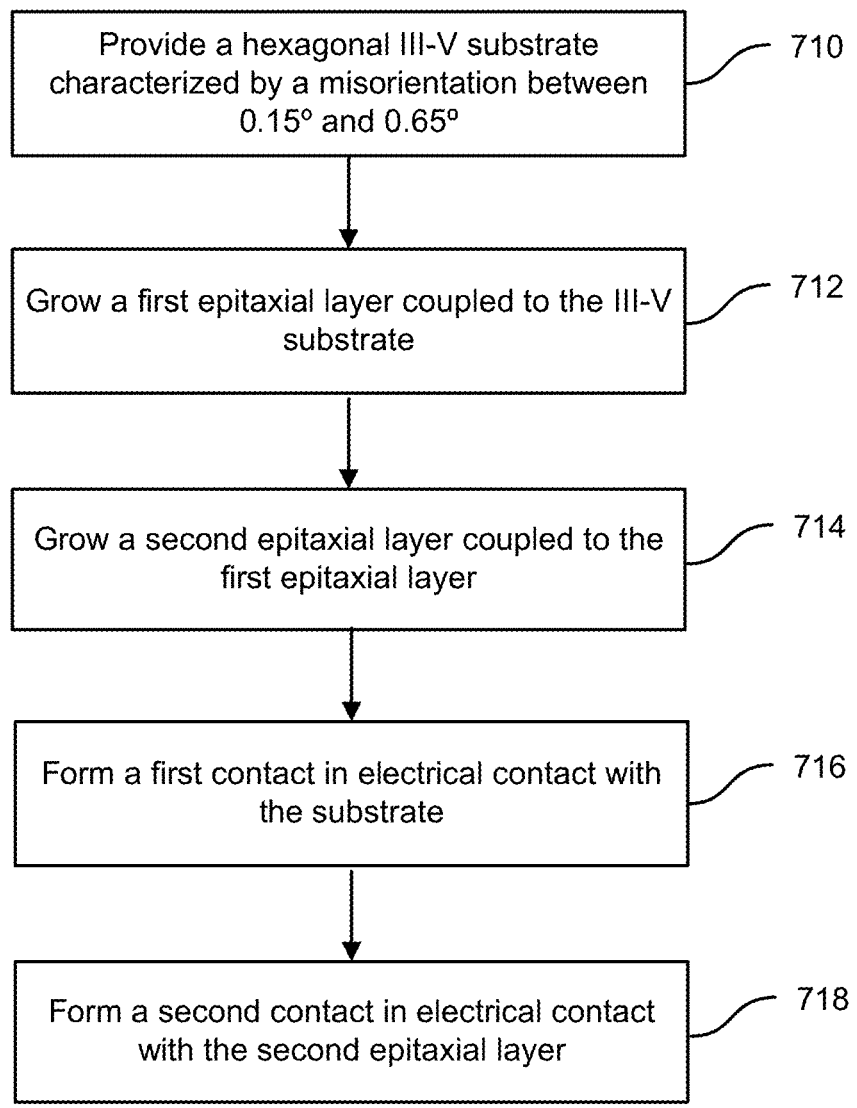
FIG. 7 is a simplified flowchart illustrating a method of fabricating an electronic device according to an embodiment of the present invention.

FIG. 7 is a simplified flowchart illustrating a method of fabricating an electronic device according to an embodiment of the present invention. Referring to FIG. 7, the method includes providing a III-V substrate having a hexagonal crystal structure and a normal to a growth surface characterized by a misorientation from the <0001> direction of between 0.15° and 0.65° (710). The III-V substrate is an n-type GaN substrate in a specific embodiment. In an embodiment, the normal to the growth surface is misoriented towards toward the negative <1$\bar{1}$00> direction, for example, in a range of between 0.4° and 0.5°. In a particular embodiment, the normal to the growth surface is characterized by a misorientation towards the <11$\bar{2}$0> direction of substantially zero degrees. In other embodiments, the misorientation has components toward/away from both the <1$\bar{1}$00> direction and the <11$\bar{2}$0> direction.

The method also includes growing a first epitaxial layer coupled to the III-V substrate (712) and growing a second epitaxial layer coupled to the first epitaxial layer (714). For some devices, the method includes forming an isolation region disposed laterally to the second epitaxial layer. In some high power device applications, the first epitaxial layer comprises an n-type GaN epitaxial layer having a thickness greater than 3 μm and the second epitaxial layer comprises a p-type GaN epitaxial layer. In some implementations, the method also includes forming a third epitaxial layer disposed between the second epitaxial layer and the second contact. A doping density of the third epitaxial layer is higher than a doping density of the second epitaxial layer.

Additionally, the method includes forming a first contact in electrical contact with the substrate (716) and forming a second contact in electrical contact with the second epitaxial layer (718). As an exemplary device, a PN diode can be fabricated using the techniques described herein, with the first contact being a cathode and the second contact being an anode of the PN diode. The electronic device can also be a Schottky diode.

It should be appreciated that the specific steps illustrated in FIG. 7 provide a particular method of fabricating an electronic device according to an embodiment of the present invention. Other sequences of steps may also be performed according to alternative embodiments. For example, alternative embodiments of the present invention may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of fabricating an electronic device, the method comprising:
    providing an n-type GaN substrate having a hexagonal crystal structure and a normal to a growth surface characterized by a misorientation from the <0001> direction of between 0.15° and 0.65°;
    growing a first n-type GaN epitaxial layer coupled to the n-type GaN substrate;
    growing a second p-type GaN epitaxial layer coupled to the first n-type GaN epitaxial layer;
    forming a first contact in electrical contact with the n-type GaN substrate; and
    forming a second contact in electrical contact with the second p-type GaN epitaxial layer.

2. The method of claim 1 wherein the normal to the growth surface is misoriented towards the negative <1$\bar{1}$00> direction.

3. The method of claim 2 wherein the misorientation is between 0.4° and 0.5°.

4. The method of claim 1 wherein the normal to the growth surface is characterized by a misorientation towards the <11$\bar{2}$0> direction of substantially zero degrees.

5. The method of claim 1 wherein the first n-type GaN epitaxial layer has a thickness greater than 3 μm.

6. The method of claim 5 wherein the first n-type GaN epitaxial layer has a thickness greater than 5 μm.

7. The method of claim 1 wherein the electronic device comprises a PN diode, the first contact comprises a cathode, and the second contact comprises an anode.

8. The method of claim 1 further comprising forming an isolation region disposed laterally to the second p-type GaN epitaxial layer.

9. The method of claim 1 further comprising forming a third III-V epitaxial layer disposed between the second p-type GaN epitaxial layer and the second contact, wherein a doping density of the third III-V epitaxial layer is higher than a doping density of the second p-type GaN epitaxial layer.

10. A method of fabricating an electronic device, the method comprising:
    providing a III-V substrate having a hexagonal crystal structure and a normal to a growth surface characterized by a misorientation from the <0001> direction of between 0.15° and 0.65°;
    growing a first III-V epitaxial layer coupled to the III-V substrate;
    growing a second III-V epitaxial layer coupled to the first III-V epitaxial layer;
    forming a first contact in electrical contact with the III-V substrate; and
    forming a second contact in electrical contact with the second III-V epitaxial layer.

11. The method of claim 10 wherein the normal to the growth surface is misoriented towards the negative <1$\bar{1}$00> direction.

12. The method of claim 11 wherein the misorientation is between 0.4° and 0.5°.

13. The method of claim 10 wherein the normal to the growth surface is characterized by a misorientation towards the <11$\bar{2}$0> direction of substantially zero degrees.

14. The method of claim 10 wherein the III-V substrate comprises an n-type GaN substrate.

15. The method of claim 10 wherein the first III-V epitaxial layer comprises an n-type GaN epitaxial layer having a thickness greater than 3 μm and the second III-V epitaxial layer comprises a p-type GaN epitaxial layer.

16. The method of claim 15 wherein the n-type GaN epitaxial layer has a thickness greater than 5 μm.

17. The method of claim 10 wherein the electronic device comprises a PN diode, the first contact comprises a cathode of the PN diode, and the second contact comprises an anode.

18. The method of claim 10 further comprising forming an isolation region disposed laterally to the second III-V epitaxial layer.

19. The method of claim 10 further comprising forming a third III-V epitaxial layer disposed between the second III-V epitaxial layer and the second contact, wherein a doping density of the third III-V epitaxial layer is higher than a doping density of the second III-V epitaxial layer.

\* \* \* \* \*